United States Patent
Li et al.

(10) Patent No.: US 10,056,469 B1
(45) Date of Patent: Aug. 21, 2018

(54) GATE CUT INTEGRATION AND RELATED DEVICE

(71) Applicant: GLOBALFOUNDRIES Inc., Grand Cayman (KY)

(72) Inventors: Hui-feng Li, Ottawa (CA); Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/430,647

(22) Filed: Feb. 13, 2017

(51) Int. Cl.
*H01L 29/66* (2006.01)
*H01L 21/762* (2006.01)
*H01L 21/3065* (2006.01)
*H01L 21/3105* (2006.01)
*H01L 21/02* (2006.01)

(52) U.S. Cl.
CPC .... *H01L 29/66545* (2013.01); *H01L 21/0217* (2013.01); *H01L 21/0228* (2013.01); *H01L 21/3065* (2013.01); *H01L 21/31056* (2013.01); *H01L 21/762* (2013.01); *H01L 29/66795* (2013.01)

(58) Field of Classification Search
CPC .... H01L 29/7855–29/7856; H01L 2029/7858; H01L 29/66545; H01L 21/823437
See application file for complete search history.

(56) References Cited

U.S. PATENT DOCUMENTS

| 2014/0273508 | A1* | 9/2014 | Li | H01L 21/02304 |
| | | | | 438/759 |
| 2016/0268399 | A1* | 9/2016 | Akarvardar | H01L 29/66795 |
| 2017/0148682 | A1* | 5/2017 | Basker | H01L 21/823431 |
| 2017/0345820 | A1* | 11/2017 | Lin | H01L 27/0886 |
| 2017/0345913 | A1* | 11/2017 | Dai | H01L 29/7851 |

* cited by examiner

*Primary Examiner* — Selim Ahmed
*Assistant Examiner* — Evan Clinton
(74) *Attorney, Agent, or Firm* — Ditthavong & Steiner, P.C.

(57) ABSTRACT

A method for forming gate cuts during RMG processing and the resulting device are provided. Embodiments include forming Si fins over a substrate; forming a STI layer over the substrate and recessed, exposing upper portions of the Si fins; forming polysilicon dummy gate electrodes perpendicular to the Si fins, separated by STI regions, on the upper portions of the Si fins and on the STI layer between the Si fins; forming a hardmask over the polysilicon dummy gate electrodes; etching through the hardmask and polysilicon dummy gate electrodes forming cavities between some of the Si fins; oxidizing polysilicon exposed on sides of the cavities and any residual polysilicon remaining at a bottom of one or more of the cavities; filling the cavities with SiN; removing the polysilicon dummy gate electrodes; and forming RMGs.

12 Claims, 8 Drawing Sheets

GATE CUT INTEGRATION AND RELATED DEVICE

TECHNICAL FIELD

The present disclosure relates to semiconductor fabrication. In particular, the present disclosure relates to replacement metal gates (RMGs) in semiconductor device fabrication in the 14 nanometer (nm) technology node and beyond.

BACKGROUND

In current semiconductor processing, as gate dimensions continue to get smaller, it is difficult to control critical dimensions CD. Critical dimensions are often controlled by spaced oxide deposition after lithography. If the spacer thickness is too thick, the gate cut reactive ion etching (RIE) might not be able to clear the polysilicon dummy gate electrode. Polysilicon residue at the bottom and corners of the cavities produced by gate cut RIE are affected by factors including gate open size, gate profile and gate height. Variability of these factors will lead to the polysilicon residuals causing tip-to-tip electrical shorts.

A need therefore exists for methodology enabling effective improvement of gate critical dimensions, mitigation of tip-to-tip shorts with effective residue removal, and effective improvement in device reliability, and the resulting device.

SUMMARY

An aspect of the present disclosure is reducing gate cut spacer thickness by 4 nm or more leading to widening critical dimensions by 8 nm or more. Another aspect includes reducing polysilicon residues following gate cut RIE due to wider critical dimensions. Any residual polysilicon left at the bottom or corners of the gate open by RIE is converted to an oxide which eliminates potential tip-to-tip shorts.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming silicon (Si) fins over a substrate; forming a shallow trench isolation (STI) layer over the substrate and recessed, exposing upper portions of the Si fins; forming polysilicon dummy gate electrodes perpendicular to the Si fins, separated by STI regions, on the upper portions of the Si fins and on the STI layer between the Si fins; forming a hardmask over the polysilicon dummy gate electrodes; etching through the hardmask and polysilicon dummy gate electrodes forming cavities between some of the Si fins; oxidizing polysilicon exposed on sides of the cavities and any residual polysilicon remaining at a bottom of one or more of the cavities; filling the cavities with silicon nitride (SiN); removing the polysilicon dummy gate electrodes; and forming RMGs in spaces formed by removing the polysilicon dummy gate electrodes.

Aspects of the present disclosure include forming a gate oxide liner over the upper portions of the Si fins prior to forming the polysilicon dummy gate electrodes. Other aspects include etching through the hardmask and polysilicon dummy gate electrodes by RIE. Certain aspects include forming a SiN layer over the hardmask concurrently with filling the cavities with SiN. Certain aspects include forming the SiN layer and filling the cavities with SiN by atomic layer deposition (ALD). Yet further aspects include forming a silicon dioxide ($SiO_2$) layer over the SiN layer formed over the hardmask. Other aspects include forming the $SiO_2$ layer by high density plasma (HDP) deposition. Certain aspects include planarizing the $SiO_2$ layer and a portion of the hardmask and SiN layer. Another aspect includes planarizing the $SiO_2$ layer and the portion of the hardmask and SiN layer by chemical mechanical polishing (CMP). Further aspects include etching the hardmask and SiN layer, exposing an upper surface of the polysilicon dummy gate electrodes. Additional aspects include forming an oxide over the substrate after removing the polysilicon dummy gate electrodes; and removing the oxide after cleaning. Yet other aspects include depositing a high-k dielectric over the Si fins prior to forming the RMGs. Another aspect of the present disclosure is a method including forming Si fins over a substrate; forming polysilicon dummy gate electrodes over the Si fins; forming gate cuts by etching through the polysilicon dummy gate electrodes forming cavities between some of the fins; oxidizing polysilicon exposed on sides of the cavities and any residual polysilicon remaining at a bottom of one or more of the cavities; filling the cavities with a nitride; removing the polysilicon dummy gate electrodes; and forming RMGs in spaces formed by removing the polysilicon dummy gate electrodes.

Aspects of the present disclosure include forming a gate oxide liner over upper portions of the Si fins prior to forming the polysilicon dummy gate electrodes. Other aspects include forming a hardmask over the polysilicon dummy gate electrodes. Certain aspects include etching through the hardmask and polysilicon dummy gate electrodes by RIE. Certain aspects include depositing a high-k dielectric over the Si fins prior to forming the RMGs.

Yet another aspect of the present disclosure includes a method forming Si fins over a substrate; forming a STI layer over the substrate and recessed, exposing upper portions of the Si fins; forming polysilicon dummy gate electrodes perpendicular to the Si fins, separated by STI regions, on the upper portions of the Si fins and on the STI layer between the Si fins; forming a hardmask over the polysilicon dummy gate electrodes; forming gate cuts by etching through the hardmask and polysilicon dummy gate electrodes forming cavities between some of the Si fins; oxidizing polysilicon exposed on sides of the cavities and any residual polysilicon remaining at a bottom of one or more of the cavities; forming a SiN layer over the hardmask concurrently with filling the cavities with SiN; forming a $SiO_2$ layer over the SiN layer formed over the hardmask; planarizing the $SiO_2$ layer and a portion of the hardmask and SiN layer; etching the hardmask and SiN exposing an upper surface of the polysilicon layer; removing the polysilicon dummy gate electrodes; and forming RMGs in spaces formed by removing the polysilicon dummy gate electrodes.

Aspects of the present disclosure include forming a gate oxide liner over the upper portions of the Si fins prior to forming the polysilicon dummy gate electrodes. Other aspects include etching through the hardmask and polysilicon dummy gate electrodes by RIE; and forming the SiN layer and filling the cavities with SiN by ALD.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of polysilicon residue causing tip-to-tip electrical shorts attendant upon gate cut RIE. In accordance with embodiments of the present disclosure, gate cut spacer thickness is reduced which widens critical dimensions to permit more efficient gate cut RIE and minimizes polysilicon residue.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
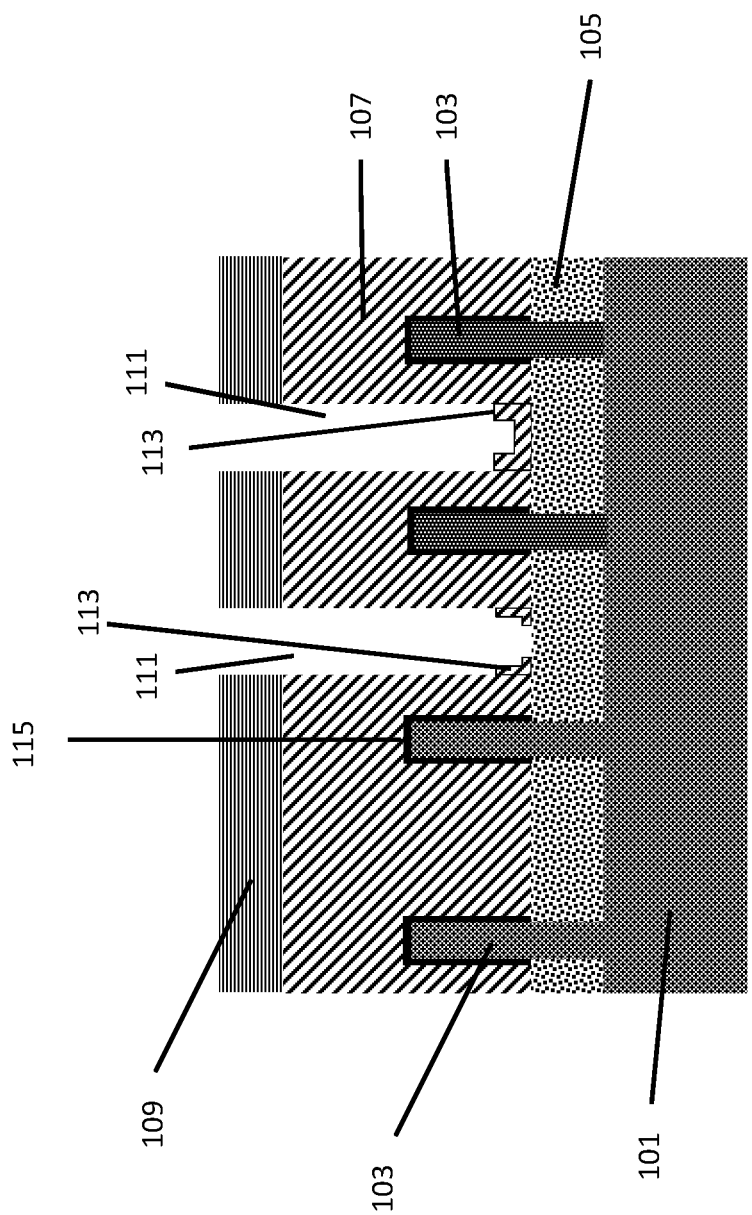
FIGS. 1 through 8 schematically illustrate a semiconductor fabrication process, in cross-sectional views along the gate, in accordance with an exemplary embodiment.

Adverting to FIG. 1, a cross-sectional view along the gate is shown. A Si substrate 101 is provided and Si fins 103 are formed over the substrate 101. A STI layer 105 is formed over the substrate 101 and recessed, exposing upper portions of the Si fins 103. Polysilicon dummy gate electrodes 107 are formed over perpendicular to the Si fins 103, separated by STI regions (not shown for illustrative convenience), on the upper portions of the Si fins 103 and on the STI layer 105 between the Si fins 103. A hardmask 109 is formed over the polysilicon dummy gate electrodes 107 and patterned with openings over locations for gate cuts. As shown in FIG. 1, an etching step cuts polysilicon dummy gate electrodes 107 through the hardmask 109 forming cavities 111 between some of the Si fins 103 at the gate cut locations. The etching step can include RIE. The RIE generates the cavities which serve as breaks in gate electrodes. Although FIG. 1 shows the cavities formed on opposite sides of the Si fins 103, the cavities can be formed at other locations along the gate electrode.

As shown in FIG. 1, a residual amount 113 of the polysilicon dummy gate electrodes 107 can remain at a bottom and corners of one or more of the cavities 111 over the STI layer 105. Although a residual amount 113 of the polysilicon dummy gate electrodes 107 is depicted in both cavities 111 in FIG. 1, there may be instances where the residual amount 113 is not present in one or more or the cavities 111 of the polysilicon dummy gate electrodes 107. A gate oxide liner 115 is deposited over the upper portions of the Si fins 103 prior to forming the polysilicon dummy gate electrodes 107 to insulate the gate electrodes from the fins.

Figure 2:
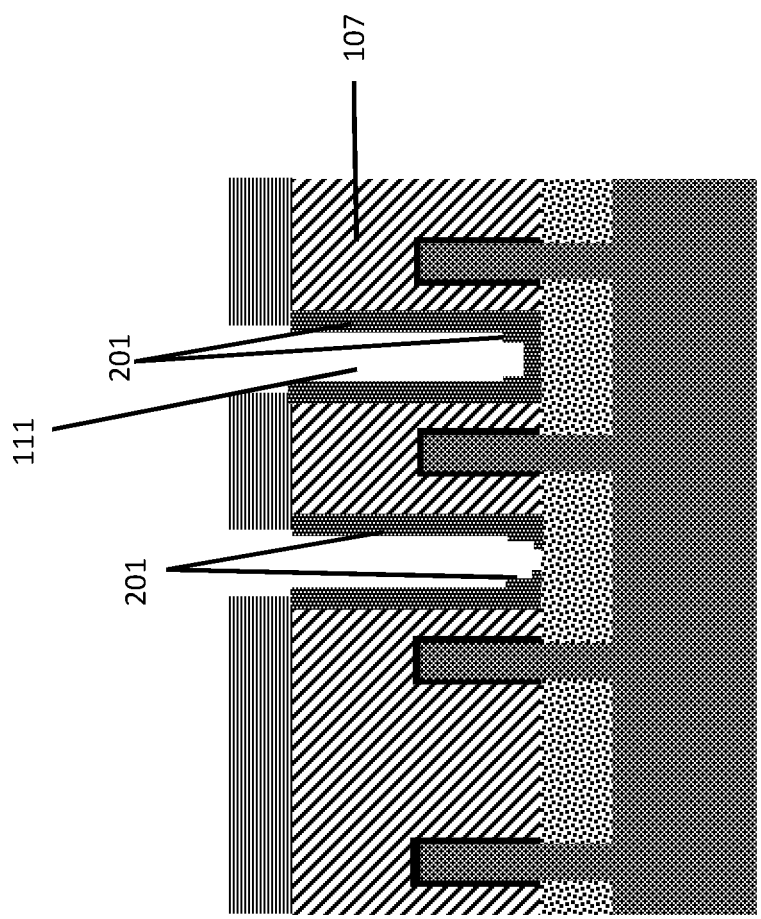
Figure 3:
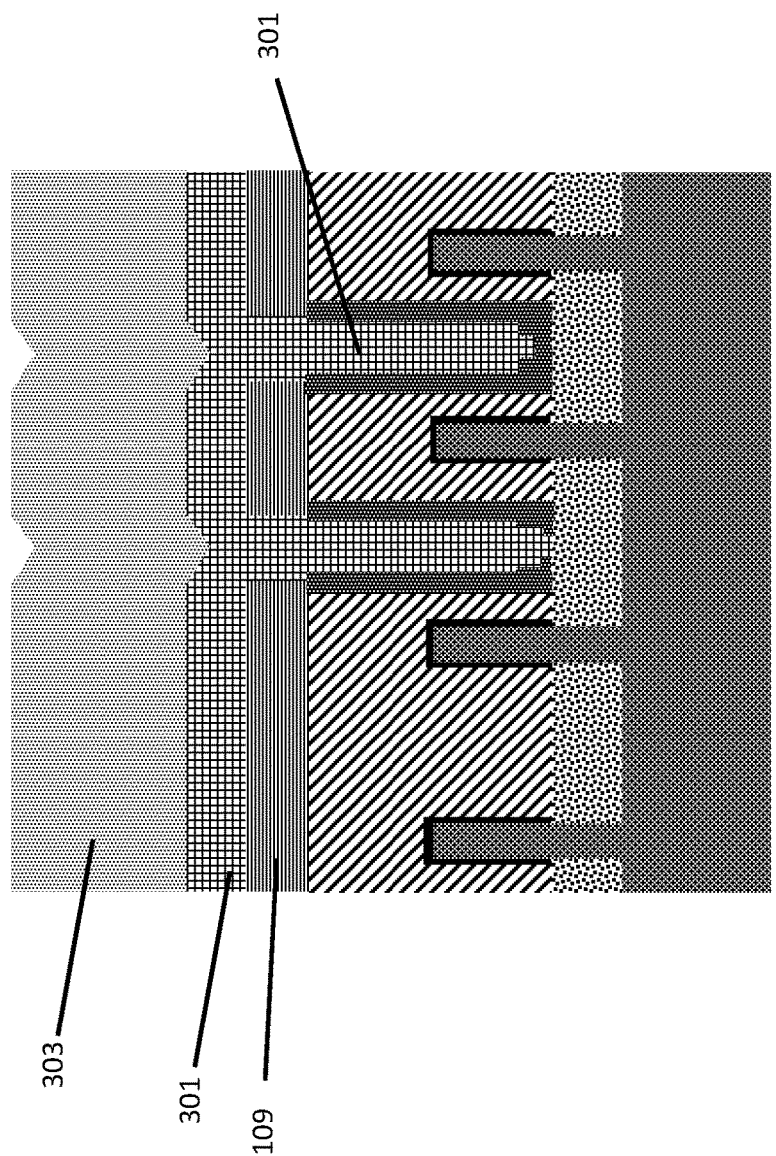

Adverting to FIG. 2, a thermal oxidation step is performed to oxidize polysilicon exposed on sides of the cavities 111, as well as any residual amount 113 of the polysilicon dummy gate electrodes 107 remaining at a bottom of one or more of the cavities 111. Oxidized regions 201 are formed as a result of the oxidation step. In FIG. 3, a SiN layer 301 is deposited over the hardmask 109 concurrently with filling the cavities 111 with SiN. The SiN layer 301 can be deposited by ALD. A $SiO_2$ layer 303 is deposited over the SiN layer 301 formed over the hardmask 109. The $SiO_2$ layer 303 is formed by HDP deposition.

Figure 4:
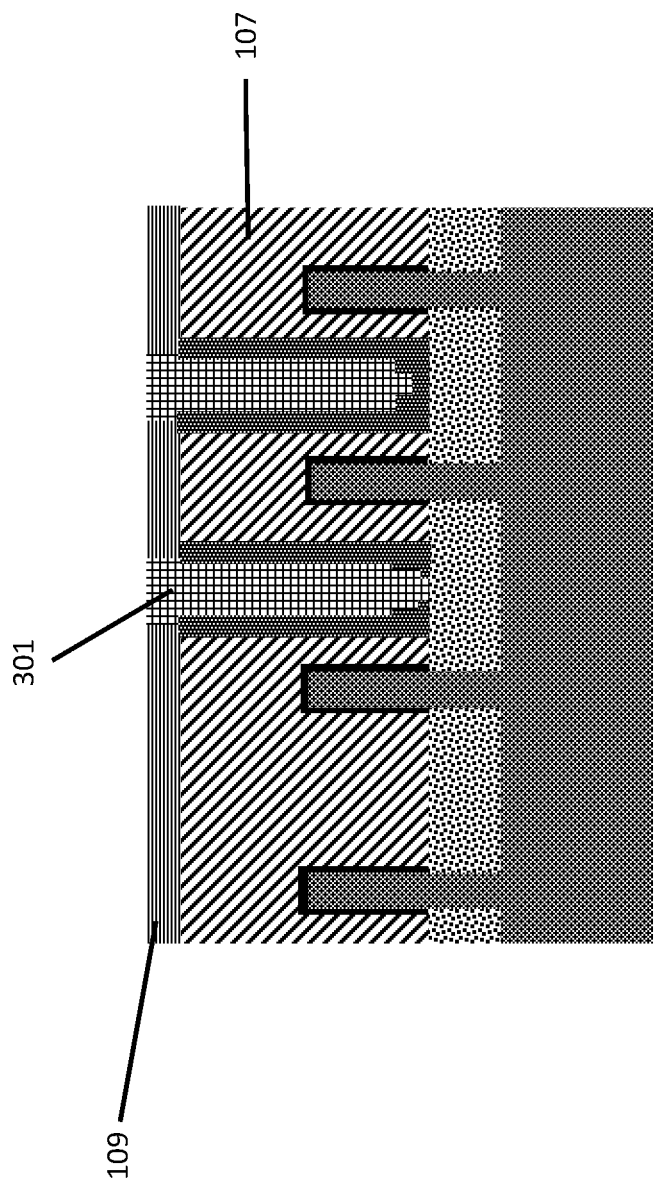
Figure 5:
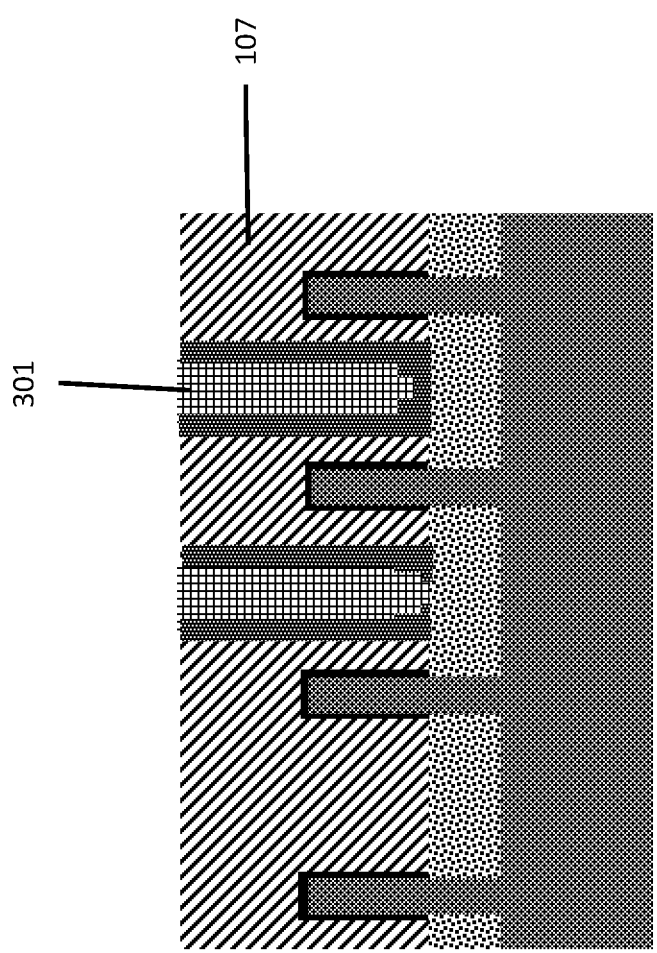
Figure 6:
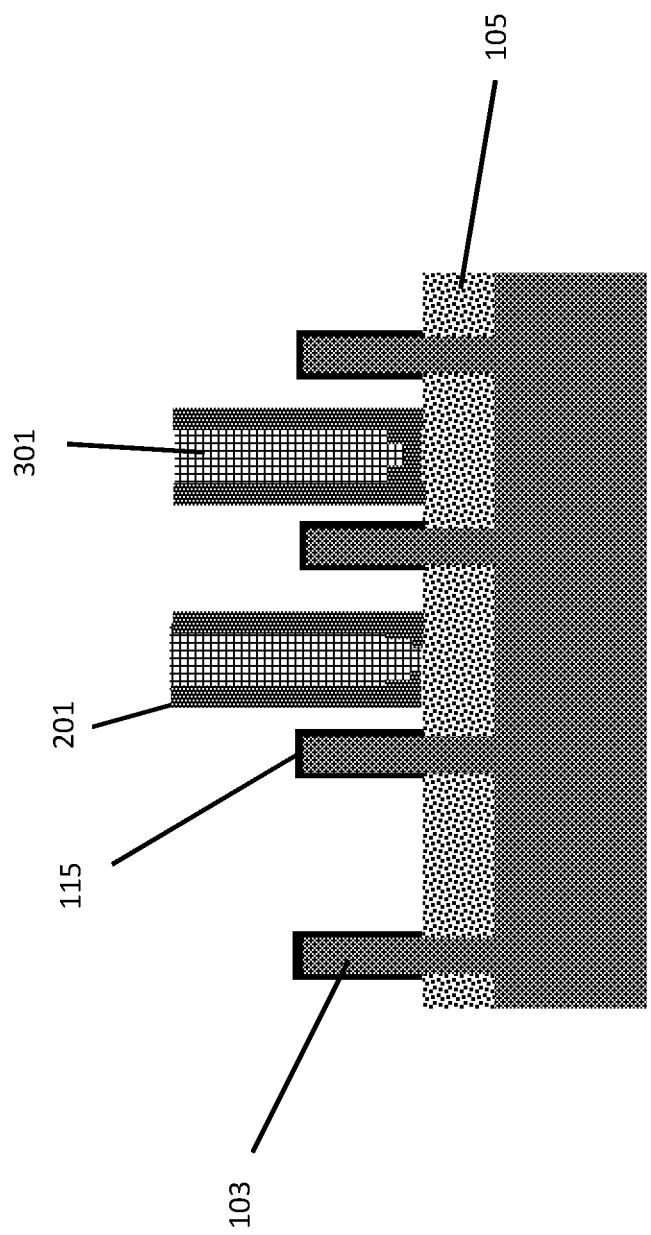

As shown in FIG. 4, the $SiO_2$ layer 303, SiN layer 301, and an upper portion of the hardmask 109 are planarized. The planarizing can be performed by CMP. Adverting to FIG. 5, a nitride etchback of the hardmask 109 and SiN layer 301 is performed, exposing an upper surface of the polysilicon dummy gate electrodes 107. Adverting to FIG. 6, the polysilicon dummy gate electrodes 107 are removed to reveal the STI layer 105 and Si fins 103 (covered by gate oxide liner 115).

Figure 7:
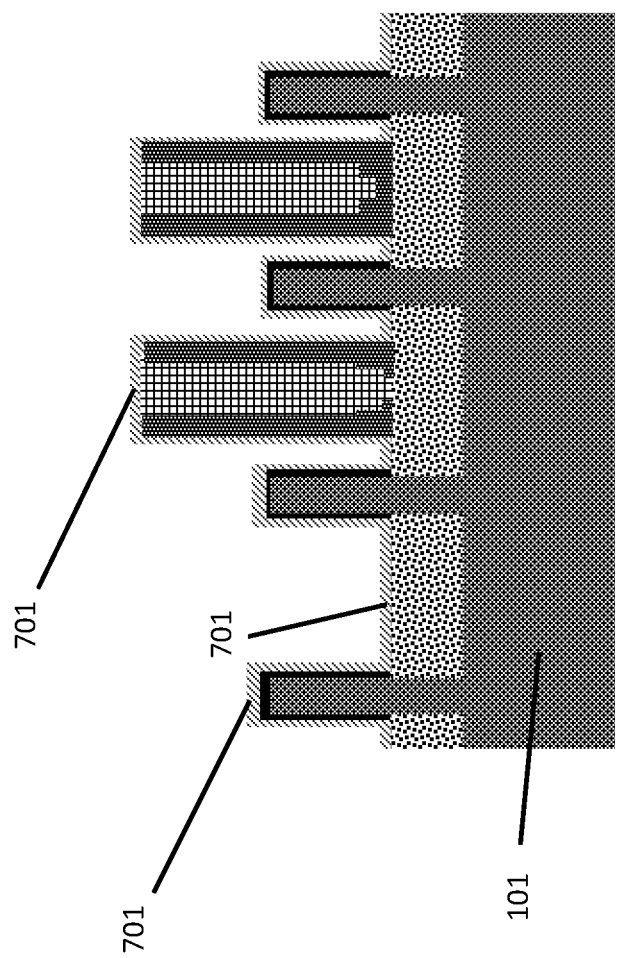

As illustrated in FIG. 7, an oxide 701 is deposited over the substrate 101 after removing the polysilicon dummy gate electrodes 107. A cleaning step is performed to remove any residue, and the oxide 701 is subsequently removed. The cleaning is controlled to prevent the oxide 701 from etching through to underlying layers. The oxide 201 thickness formed after dummy gate cut becomes thinner.

Figure 8:
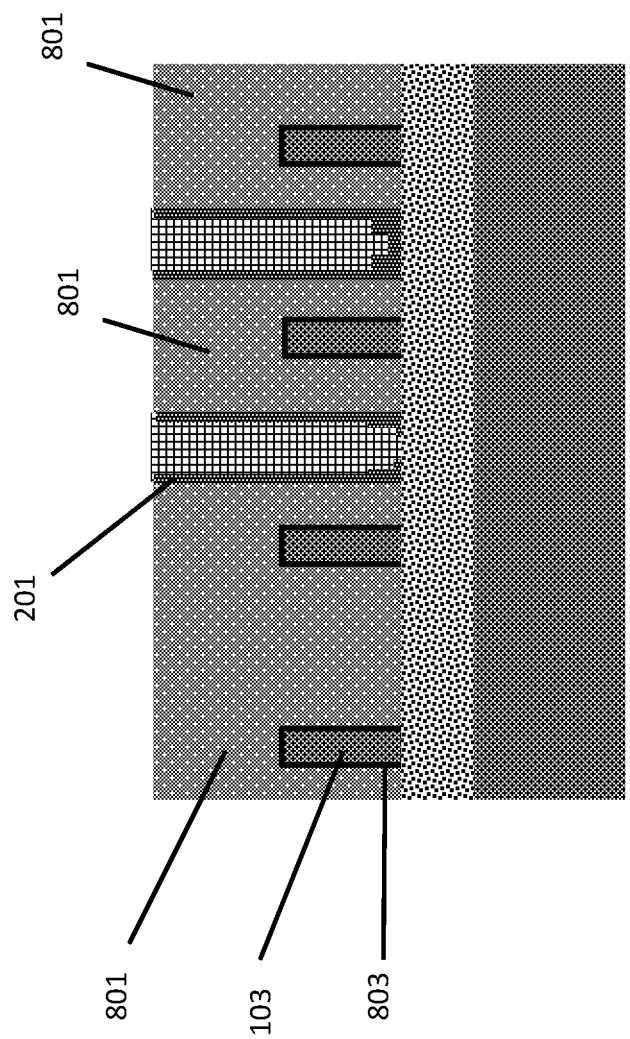

Adverting to FIG. 8, RMGs 801 are formed in spaces formed by removing the polysilicon dummy gate electrodes 107. Prior to forming the RMGs 801, a high-k dielectric layer 803 is deposited over the Si fins 103. Additional RMG manufacturing follows using conventional processing steps.

The embodiments of the present disclosure can achieve several technical effects, including improving gate critical dimensions and minimizing polysilicon residue, thereby effectively improving device reliability and reducing tip-to-tip electrical shorts. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for advanced technology nodes, such as the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming silicon (Si) fins over a substrate;
forming a shallow trench isolation (STI) layer over the substrate and recessed, exposing upper portions of the Si fins;
forming polysilicon dummy gate electrodes perpendicular to the Si fins, separated by STI regions, on the upper portions of the Si fins and on the STI layer between the Si fins;
forming a hardmask over the polysilicon dummy gate electrodes;
etching through the hardmask and polysilicon dummy gate electrodes forming cavities between some of the Si fins;
oxidizing polysilicon exposed on sides of the cavities and any residual polysilicon remaining at a bottom of one or more of the cavities;
filling the cavities with silicon nitride (SiN);
forming a SiN layer over the hardmask concurrently with filling the cavities with SiN;
forming a silicon dioxide ($SiO_2$) layer over the SiN layer formed over the hardmask;
planarizing the $SiO_2$ layer and a portion of the hardmask and SiN layer;
removing the polysilicon dummy gate electrodes; and
forming replacement metal gate electrodes (RMGs) in spaces formed by removing the polysilicon dummy gate electrodes.

2. The method according to claim 1, further comprising:
forming a gate oxide liner over the upper portions of the Si fins prior to forming the polysilicon dummy gate electrodes.

3. The method according to claim 1, comprising etching through the hardmask and polysilicon dummy gate electrodes by reactive ion etching (ME).

4. The method according to claim 1, comprising:
forming the SiN layer and filling the cavities with SiN by atomic layer deposition (ALD).

5. The method according to claim 1, comprising forming the $SiO_2$ layer by high density plasma (HDP) deposition.

6. The method according to claim 1, comprising planarizing the $SiO_2$ layer and the portion of the hardmask and SiN layer by chemical mechanical polishing (CMP).

7. The method according to claim 1, further comprising:
etching the hardmask and SiN layer, exposing an upper surface of the polysilicon dummy gate electrodes.

8. The method according to claim 7, further comprising:
forming an oxide over the substrate after removing the polysilicon dummy gate electrodes; and
removing the oxide after cleaning.

9. The method according to claim 8, further comprising:
depositing a high-k dielectric over the Si fins prior to forming the RMGs.

10. A method comprising:
forming silicon (Si) fins over a substrate;
forming a shallow trench isolation (STI) layer over the substrate and recessed, exposing upper portions of the Si fins;
forming polysilicon dummy gate electrodes perpendicular to the Si fins, separated by STI regions, on the upper portions of the Si fins and on the STI layer between the Si fins;
forming a hardmask over the polysilicon dummy gate electrodes;
forming gate cuts by etching through the hardmask and polysilicon dummy gate electrodes forming cavities between some of the Si fins;
oxidizing polysilicon exposed on sides of the cavities and any residual polysilicon remaining at a bottom of one or more of the cavities;
forming a silicon nitride (SiN) layer over the hardmask concurrently with filling the cavities with SiN;
forming a silicon dioxide ($SiO_2$) layer over the SiN layer formed over the hardmask;
planarizing the $SiO_2$ layer and a portion of the hardmask and SiN layer;
etching the hardmask and SiN exposing an upper surface of the polysilicon layer;
removing the polysilicon dummy gate electrodes; and
forming replacement metal gate electrodes (RMGs) in spaces formed by removing the polysilicon dummy gate electrodes.

11. The method according to claim 10, further comprising:
forming a gate oxide liner over the upper portions of the Si fins prior to forming the polysilicon dummy gate electrodes.

12. The method according to claim 10, comprising:
etching through the hardmask and polysilicon dummy gate electrodes by reactive ion etching (ME); and
forming the SiN layer and filling the cavities with SiN by atomic layer deposition (ALD).

* * * * *